Feb. 19, 1957 E. A. GOLDBERG 2,782,303

SWITCHING SYSTEM

Filed April 30, 1952

INVENTOR
Edwin A. Goldberg
BY Morris Rabkin
ATTORNEY

United States Patent Office 2,782,303

Patented Feb. 19, 1957

2,782,303

SWITCHING SYSTEM

Edwin A. Goldberg, Princeton Junction, N. J., assignor to Radio Corporation of America, a corporation of Delaware Application April 30, 1952, Serial No. 285,198

13 Claims. (Cl. 250—27)

This invention relates generally to electronic switches, and more particularly to an improvement in electronic switches of the type employing diodes or unilateral impedances.

Diodes or rectifiers are finding widespread use as gating or switching elements where amplification of the signal to be switched is not required, yet where the switching must occur at the speed of the operation of electronic apparatus. A reason for the increased use is that the well known semi-conductor materials, such as silicon or germanium, may be used as rectifiers and the usual filament power supply and other attendant circuitry usually required for electron discharge tubes are obviated.

One of the difficulties attendant with diode switching circuits is maintaining the level of the signal being switched. There is usually some loss due to the signal being switched having to overcome blocking bias on the diode. Another difficulty arises from the capacitance introduced by the wiring of the diode. This prevents rapid changes in the level of signals being switched and thus limits the speed of switching or operation.

An object of the present invention is to provide an improved diode switching system which substantially maintains the level of the signal being switched.

A further object of this invention is to provide an improved diode switching system which substantially eliminates the effects of the capacitance introduced by the wiring of the diodes.

Still a further object of this invention is to provide a novel and inexpensive diode switching system.

These and other objects of the present invention are achieved by providing a switching system wherein a first, second and fifth diode have their cathodes tied together as a first junction, a third, fourth and sixth diode have their cathodes tied together as a second junction. Signals to be switched are applied to the anodes of the first and third diodes; switching signals are applied to the anodes of the fifth and sixth diodes. The anodes of the second and fourth diodes are connected together and serve as an output terminal. A bias is applied to the first, second, third and fourth diodes so that at all times a finite current is provided for the two diodes switched on by the switching signals. Which signal appears at the output terminal is determined by the switching signal.

Figure 1:
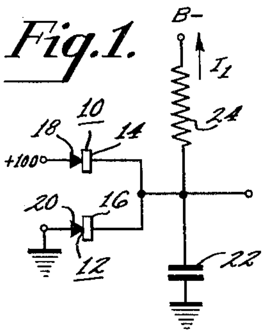
Figure 2:
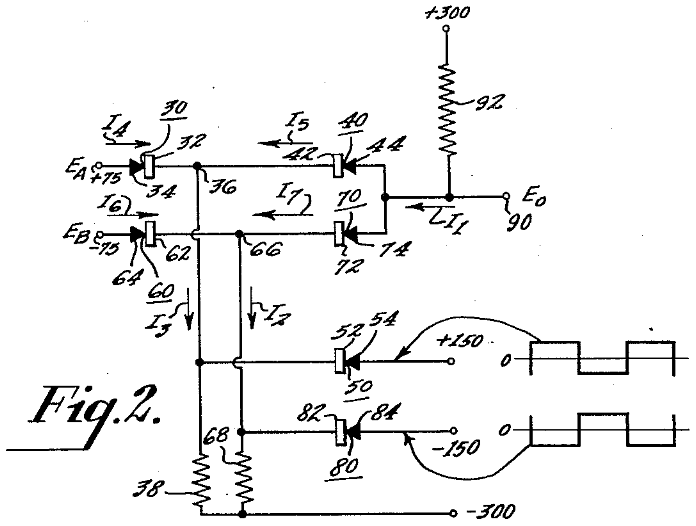
Figure 3:
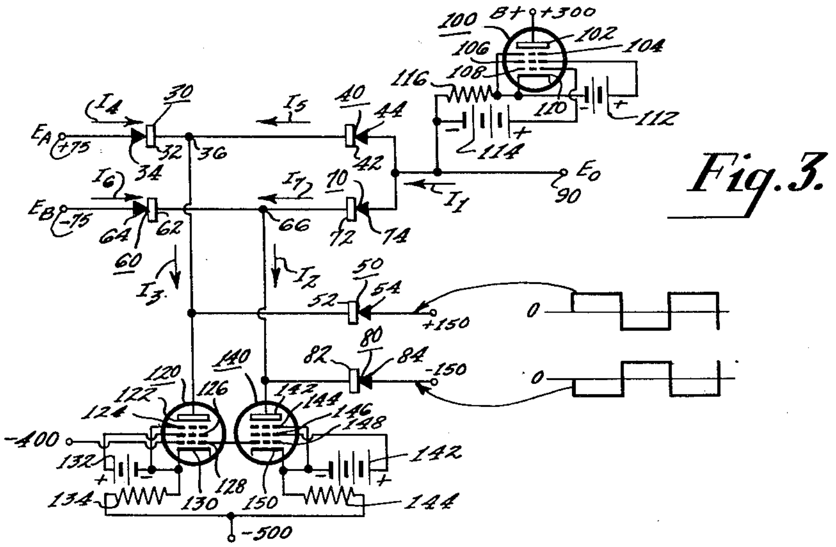
Figure 4:
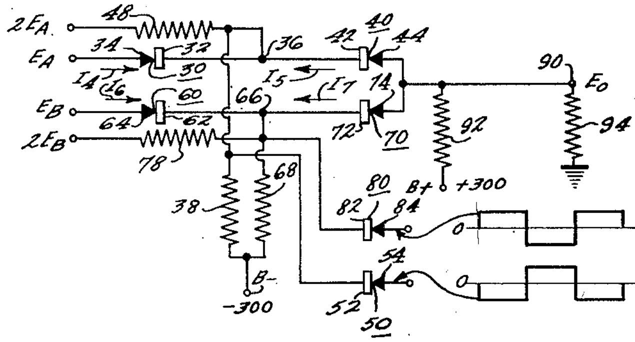

The novel features of the invention, as well as the invention itself, both as to its organization and method of operation will best be understood from the following description when read in connection with the accompanying drawings, in which Figure 1 is a circuit diagram shown to assist in the explanation of a feature of my invention, Figures 2, 3 and 4 are circuit diagrams of several embodiments of my invention.

Reference is now made to Figure 1, which shows a diode circuit, for the purposes of illustrating the effect of wiring capacitance in that circuit. Two diodes 10, 12 have their cathodes 14, 16 connected together to serve as an output. The capacitance 22 connected between said output and ground represents the wiring capacitance. If the anode 20 of one of the two diodes 12 is connected to ground and the anode 18 of the other diode is at a positive potential of, for example, approximately 100 volts, the output terminal attains a potential of 100 volts and the capacitor 22 representing the wiring capacitance becomes charged. Now, if the potential at the anode 18 is reduced to 50 volts, back voltage is present on both diodes. The capacitor 22 will have no discharge path. Accordingly, the voltage of the output terminal will remain at 100 volts and will not follow the potential change of the input terminal when it is reduced. To remedy this situation, the output terminal is connected through a high value resistor 24 to a source of negative voltage. This causes a current $I_1$ to flow through the diode 10, through the junction of the two diodes and through the resistor 24. This current bleeds the charge from the capacitor 22. The maximum rate at which the output voltage on the output terminal will now follow a decreasing input voltage on one of the diode anodes is given by the following formula:

$$\text{Max}\cdot\frac{dE_0}{dt}=\frac{I_1}{C}$$

where $E_0$ is the voltage at the output terminal, and C is the capacitance of capacitor 22.

Otherwise stated, the presence of the biasing potential and resistor provides a discharge path for the capacitor and this permits the output of the diodes to follow the input.

Reference is now made to Fig. 2, where there is shown a circuit diagram of an embodiment of the invention. A first diode 30 has its cathode 32 coupled to the cathode 42, 52 of a second diode 40 and a fifth diode 50. This common cathode connection serves as a first junction point 36. A third diode 60 has its cathode 62 connected to the cathodes 72, 82 of a fourth and sixth diode 70, 80, respectively to serve as a second junction point 66. The anodes 44, 74 of the second and fourth diodes 40, 70 are connected together and connected to an output terminal 90. Voltages to be switched are applied to the anode 34 of the first diode 30 and the anode 64 of the third diode 60. Switching voltages are applied to the anodes 54, 84 of the fifth diode 50 and sixth diode 80. These switching voltages are applied in paraphase fashion. The output terminal 90 is connected through a high value resistor 92 to a positive bias source. The first and second junction 36, 66 are connected through high value resistors 38, 68 to a common negative bias source. By way of illustration, these sources are shown respectively as +300 and −300 volts. The application of the bias between the output junction and the first and second junctions serves to maintain the diodes 30, 40 or 60, 70 in the conducting side of the switch in a condition where they conduct a finite current at all times. This serves the purpose of presenting a discharge path for the wiring capacitance which is present across the diodes to ground, and thus permits the output to follow rapidly the input voltage when it is decreased.

As an explanation of the operation of the switch, let it be assumed that voltages to be switched having a value of +75 volts and −75 volts are respectively applied to the anodes of the first and third diodes 30, 60. Switching voltages, which must exceed the amplitude of the voltages to be switched, having respective values of +150 volts and −150 volts are applied to the anodes of the fifth and sixth diodes 50, 80. The fifth diode will conduct and this places substantially 150 volts on the cathode of the first diode. Accordingly, this prevents the first diode from conducting. The third diode, however, has no blocking bias applied to its cathode, since the sixth diode remains essentially non-conducting. Accordingly, current flows through the third and fourth diodes and substantially −75 volts is switched through these two diodes to the output terminal 90. A reversal of the switching voltages applied to the anodes of the fifth and sixth diodes will cause the sixth diode to be rendered conducting and the fifth diode non-conducting. This will prevent the third diode from conducting and will permit current to flow through the first diode, thus switching +75 volts to the output terminal. By virtue of the current being applied through the conducting diodes, 40, 70 the output terminal can follow changes in the applied switching voltages extremely rapidly.

If the diodes were perfect there would be no voltage drop across a conducting diode and the output voltage would be equal to the input voltage which is being switched. However, the decrease in amplitude of a gated or switched voltage from the input to the output depends upon the resistance of the conducting diodes. The +300 volt bias permits rapid changes at the output terminal and the −300 volt bias permits rapid changes at the first and second junctions. Since diodes are not perfect and do exhibit voltage drop when conducting current in a forward direction, the magnitude of the voltage drop is a function of the value of the current flow. If the currents through the two diodes in the conducting side of the switch shown in Fig. 2 are made equal and the diodes have similar characteristics, the resulting voltage drops would be equal and in opposite directions, and thus would cancel. Thereby the output voltage of the switching system can be made equal to the voltages being switched in spite of the fact that voltage drops occur in the conducting diodes.

Referring to Fig. 3, the same diode configuration and interconnection as shown in Fig. 2 may be seen. However, there are substituted for the three high value resistors three substantially constant current electron discharge tubes 100, 120, 140, preferably pentodes. The first one of the pentodes 100 has its anode 102 connected to the positive bias source. The suppressor grid 104 is connected to its cathode 110; its screen grid 106 is also connected to its cathode 110 through a bias battery 112, its control grid is connected to the output terminal through a bias battery 114. A cathode resistor 116 is connected between its cathode and the output terminal. The second and third of the pentodes 120, 140 respectively have their anodes 122, 142 connected to the first and second junctions, 36, 66, their suppressor grids 124, 144 connected to their cathodes 130, 150, their screen grids 124, 144 connected through bias sources 132, 142 to their cathodes, their control grids 128, 148 connected to a negative bias source, and their cathodes 130, 150 connected through cathode load resistors 134, 144 to a still more negative bias source. The bias values shown in the diagrams are for the purpose of illustration of an operative embodiment and are not to be taken as limiting.

The tubes are all biased so as to be conducting with a constant current. The arrangement is such that the current from the second junction 66 to the pentode 140 is equal to the current from the first junction 36 to the pentode 120, and this current equals twice the current which will flow from the pentode 100 connected to the output junction 90. Furthermore, these currents have a constant value regardless of the value of the potentials being switched or the state of the switch. This insures that the currents flowing into the first junction 36 through the first and second diodes 30, 40 are equal when these diodes are permitted to conduct and that the currents flowing into the second junction 66 through the third and fourth diodes 60, 70 are also equal when these diodes are permitted to conduct. Since the currents through the switching diodes have the same values, the output voltage provided by this switch is equal to the input voltage.

Reference is now made to Fig. 4 which shows another embodiment of the invention. This arrangement insures that the currents through the first diode equals the current through the second diode and the current through the third diode equals the current through the fourth diode when these respective combinations are selected by means of the signals applied to the fifth and sixth diode anodes. This embodiment does not permit constant current to flow through the two conducting diodes but does permit the currents through the two conducting diodes to be essentially equal and thus their voltage drops are also essentially equal and compensating. The diode configuration and interconnections are the same as is shown in the previous embodiment in Figure 2 and have similar reference numerals applied thereto. It is necessary, however, to provide additional potentials which must be greater than the potentials being switched. These additional potentials are applied to the first junction 36 through a resistor 48 and to the second junction 66 through a resistor 78. A resistor 94 is shown as connected between the output junction 90 and ground for the purpose of representing the impedance into which this switch operates.

The following relationships between the resistances R of the various resistors in Fig. 4 may be used to obtain the above mentioned operating conditions where the additional voltages applied are twice the values of the voltages being switched (the subscripts are the reference numerals of the resistors in Fig. 4):

$$R_{38}=R_{68}=0.5R_{92}$$

$$R_{48}=R_{78}=\frac{R_{92}R_{94}}{4R_{94}+2R_{92}}$$

Some typical values in ohms which may be used, and which satisfy the above relationships are:

| | |
|---|---|
| $R_{38}$ | 125,000 |
| $R_{68}$ | 125,000 |
| $R_{92}$ | 250,000 |
| $R_{48}$ | 50,000 |
| $R_{78}$ | 50,000 |
| $R_{94}$ | 500,000 |

For the generation of the paraphase switching voltages which are applied to the terminals of the fifth and sixth diodes, by way of example, a two-tube trigger circuit of the binary type may be used. These trigger circuits are the type well known in the art and are found described on pages 36–62, in the volume by O. S. Puckle, entitled "Time Bases," published by John Wiley and Sons, Inc.

For the operation of the switch, it is necessary that these switching voltages exceed the amplitude of the voltages being switched.

There has been described and shown above a switching circuit of the type employing diodes which permits fast switching of the input voltages substantially without alteration in amplitude. The switch is novel and economical to build.

What is claimed is:

1. A switching system comprising at least six diodes each having an anode and cathode, the cathode of a first, second and fifth of said diodes being connected together, the cathodes of a third, fourth and sixth of said diodes being connected together, the anodes of said second and fourth diodes being connected together, means to apply a negative bias to each of said connected together cathodes, means to apply a positive bias to said connected together anodes, means to apply switching signals to the anodes of said fifth and sixth diodes, means to apply signals to be switched to the anodes of said first and third diodes, and means to derive switched signals from the connected together anodes of said first and third diodes.

2. A switching system as recited in claim 1 wherein said means to apply a negative bias to each of said connected together cathodes includes a pair of constant current electron discharge tubes, and said means to apply a positive bias to said connected together anodes includes a constant current electron discharge tube.

3. A switching system comprising at least six diodes each having an anode and a cathode, the cathodes of a first, second and fifth of said diodes being connected together, the cathodes of a third, fourth and sixth of said diodes being connected together, the anodes of said second and fourth diodes being connected together, means to apply a negative bias to each of said connected together cathodes, means to apply a positive bias to said connected together anodes, means to apply switching signals to the anodes of said fifth and sixth diodes, means to apply a first signal to be switched to the anode of said first diode, means to apply a second signal to be switched to the anode of said third diode, means to apply a bias to the cathode of said first diode having a value in excess of the value of said first signal, means to apply a bias to the cathode of said third diode having a value in excess of the value of said second signal, and means to derive one of said signals to be switched from said connected together anodes as determined by said switching signals.

4. A switching system comprising at least six unilateral diodes, a first, second and fifth of said diodes having their cathodes connected together, a third, fourth and sixth of said diodes having their cathodes connected together, the anodes of the second and fourth diodes being connected together, a first resistor having one end connected to said connected together anodes, means to apply a positive bias to said connected together anodes through said first resistor, a second resistor having one end connected to the connected together cathodes of said first, second and fifth diodes, a third resistor having one end connected to the connected together cathode of said third, fourth and sixth diodes, means to apply a negative bias to each of said connected together cathodes through said second and third resistances, means to apply switching signals to the anodes of said fifth and sixth diodes, means to apply signals to be switched to the anodes of said first and third diodes, and means to derive switched signals from the connected together anodes of said second and fourth diodes.

5. A switching system comprising at least six diodes, each having an anode and cathode, means connecting together the cathodes of a first, second and fifth of said diodes, means connecting together the cathodes of a third, fourth and sixth of said diodes, means connecting together the anodes of said second and fourth diodes, means to apply switching signals to the anodes of said fifth and sixth diodes, means to bias continuously said second and fourth diodes to draw a finite current in the forward direction at all times when rendered conducting by said switching signals, means to apply signals to be switched to the anodes of said first and third diodes, and means to derive the one of said signals which is switched from said connected together anodes.

6. A switching system comprising a plurality of diodes, each having a first and a second electrode, the same first electrodes of first and second of said diodes being connected together to form a first junction, the same first electrodes of third and fourth of said diodes being connected together to form a second junction, the same second electrodes of said second and fourth diodes being connected together to form a third junction, means to apply voltages to said first and second junctions to bias all of said diodes to draw a finite current in the forward direction, additional means to apply a voltage to said third junction to bias continuously said second and fourth diodes to draw a finite current in the forward direction, means to apply signals to be switched to the second electrodes of said first and third diodes, and means to apply switching signals to said first and second junctions to permit a desired one of said signals to be switched to appear at said third junction.

7. A switching system comprising at least six diodes, each having an anode and cathode, means connecting together the cathodes of first, second and fifth of said diodes in a first junction, means connecting together the cathodes of third, fourth and sixth of said diodes in a second junction, means connecting together the anodes of said second and fourth diodes in a third junction, at least three constant current electron discharge tubes each having an anode, a cathode, and a control grid, means coupling the cathode of one of said constant current tubes to said third junction, means to apply a positive operating potential to the anode of said one tube, means to apply a bias to the control grid of said one tube to maintain it in a conducting condition, means connecting the anode of a second of said constant current tubes to said first junction, means connecting the anode of the third of said constant current tubes to said second junction, means to apply a negative bias to the cathodes of said second and third constant current tubes, means to apply a bias to the control grids of said second and third constant current tubes to maintain them in a conducting condition, means to apply switching signals to the anodes of said fifth and sixth diodes, means to apply signals to be switched to the anodes of said first and third diodes, and means to derive switched signals from said third junction.

8. A switching system comprising at least six diodes each having an anode and cathode, means connecting together the cathodes of first, second and fifth of said diodes in a first junction, means connecting together the cathodes of third, fourth and sixth of said diodes in a second junction, means connecting together the anodes of said second and fourth diodes in a third junction, a first and a second resistor connected to said first junction, a third and a fourth resistor connected to said second junction, a fifth and sixth resistor connected to said third junction, means to apply a positive bias to said third junction through said fifth resistor, means to apply a negative bias to said first and second junctions through said first and third resistors whereby said second and fourth diodes conduct a finite current, means to apply switching signals to the anodes of said fifth and sixth diodes, means to apply signals to be switched to the anodes of said first and third diodes, means to apply a bias to said first junction through said second resistor which exceeds the amplitude of the signals to be switched applied to said first diode, means to apply a bias to said second junction through said fourth resistor which exceeds the amplitude of the signal to be switched applied to said third diode, and means to derive the switched signal as output across said sixth resistor as determined by the polarity of the applied switching signals.

9. A switching system comprising a plurality of unilateral impedances each having a first and second electrode, the first electrodes of a first and a second of said impedances being connected together to form a first junction, the first electrodes of a third and a fourth of said impedances being connected together to form a second junction, the second electrodes of said second and fourth impedances being connected together to form a third junction, means to apply signal voltages to be switched to the second electrodes of said first and third impedances, means to apply switching signals to said first and second junctions to block forward current flow through one of said first and third impedances and to permit forward current flow through the other of said first and third impedances, whereby a desired one of said signals to be switched appears at said third junction, and means to bias said second and fourth impedances toward conduction in the forward direction and to produce equal amplitude forward current flow in said first and second impedances and equal amplitude forward current flow in said third and fourth impedances to provide substantially equal voltage drops across said first and second impedances and substantially equal voltage drops across said third and fourth impedances.

10. A switching system as recited in claim 9 wherein the first electrodes of a fifth and a sixth of said impedances are respectively connected to said first and second junctions, and said means to apply switching signals is connected to the second electrodes of said fifth and sixth impedances.

11. A switching system as recited in claim 9 wherein said means to bias and to produce equal forward current flow includes separate constant current devices connected to said first, second and third junctions.

12. A switching system comprising a plurality of unilateral impedances each having a first electrode and a second electrode, the first electrodes of a first and a second of said impedances being connected together to form a first junction, the first electrodes of a third and a fourth of said impedances being connected together to form a second junction, the second electrodes of said second and fourth impedances being connected together to form a third junction, the first electrodes of a fifth and sixth of said impedances being respectively connected to said first and second junctions, means to apply signal voltages to be switched to the second electrodes of said first and third impedances, means connected to the second electrodes of said fifth and sixth impedances selectively to apply switching signals to said first and second junctions to block forward current flow through one of said first and third impedances and to permit forward current flow through the other of said first and third impedances, whereby a desired one of said signals to be switched appears at said third junction, and means to bias said second and fourth impedances toward conduction in the forward direction and to regulate the forward current flow in said first and second impedances and in said third and fourth impedances to provide substantially equal voltage drops across said first and second impedances and substantially equal voltage drops across said third and fourth impedances, said means to bias and to regulate including separate means for applying biasing voltages to said first, second and third junctions, and first and second means respectively connected to said first and second junctions for supplying voltages of greater amplitude than and proportional to the signal voltages respectively applied to said first and second impedances.

13. A switching system comprising a plurality of unilateral impedances each having a first electrode and a second electrode, the first electrodes of a first and a second of said impedances being connected together to form a first junction, the first electrodes of a third and a fourth of said impedances being connected together to form a second junction, the second electrodes of said second and fourth impedances being connected together to form a third junction, and means to apply signal voltages to be switched to the second electrodes of said first and third impedances, means to apply switching signals to said first and second junctions to block forward current flow through one of said first and third impedances and to permit forward current flow through the other of said first and third impedances, whereby a desired one of said signals to be switched appears at said third junction, and means to bias said second and fourth impedances toward conduction in the forward direction and to regulate the forward current flow in said first and second impedances and in said third and fourth impedances to provide substantially equal voltage drops across said first and second impedances and substantially equal voltage drops across said third and fourth impedances, said last mentioned means including separate means for applying biasing voltages to said first, second, and third junctions, and separate means respectively connected to said first and second junctions for supplying voltages of greater amplitude than and proportional to the signal voltages respectively applied to said first and second impedances.

References Cited in the file of this patent

UNITED STATES PATENTS

| | | |
|---|---|---|
| 2,535,303 | Lewis | Dec. 26, 1950 |
| 2,576,026 | Meacham | Nov. 20, 1951 |
| 2,632,845 | Goldberg | Mar. 24, 1953 |